US011404251B2

(12) United States Patent
Yamaguchi et al.

(10) Patent No.: US 11,404,251 B2
(45) Date of Patent: Aug. 2, 2022

(54) PROCESSING APPARATUS FOR PROCESSING TARGET OBJECT

(71) Applicant: Tokyo Electron Limited, Tokyo (JP)

(72) Inventors: Shin Yamaguchi, Miyagi (JP); Akiyoshi Mitsumori, Miyagi (JP); Takehiko Arita, Miyagi (JP); Koichi Murakami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 332 days.

(21) Appl. No.: 15/885,933

(22) Filed: Feb. 1, 2018

(65) Prior Publication Data

US 2018/0218886 A1 Aug. 2, 2018

(30) Foreign Application Priority Data

Feb. 2, 2017 (JP) .............................. JP2017-017846

(51) Int. Cl.
*H01J 37/32* (2006.01)
*H01L 21/67* (2006.01)
*H01L 21/683* (2006.01)

(52) U.S. Cl.
CPC .. *H01J 37/32724* (2013.01); *H01L 21/67069* (2013.01); *H01L 21/67103* (2013.01); *H01L 21/67109* (2013.01); *H01L 21/6831* (2013.01); *H01L 21/6833* (2013.01); *H01J 2237/334* (2013.01)

(58) Field of Classification Search
None
See application file for complete search history.

(56) References Cited

U.S. PATENT DOCUMENTS

| 7,033,444 | B1 | 4/2006 | Komino et al. |
| 2001/0045269 | A1* | 11/2001 | Yamada ................ F28D 9/0012 165/80.1 |
| 2003/0168439 | A1* | 9/2003 | Kanno .............. H01L 21/67109 219/390 |
| 2004/0097088 | A1* | 5/2004 | Kitayama ............... C30B 31/16 438/694 |

(Continued)

FOREIGN PATENT DOCUMENTS

| JP | 2001-068538 A | 3/2001 |
| JP | 2002-009049 A | 1/2002 |

(Continued)

*Primary Examiner* — Parviz Hassanzadeh
*Assistant Examiner* — Tiffany Z Nuckols
(74) *Attorney, Agent, or Firm* — Pearne & Gordon LLP

(57) ABSTRACT

A cooling table includes a first portion, a second portion, a first path, a second path and a third path. An electrostatic chuck is provided on the first portion, and the first portion is provided on the second portion. The first path is provided within the first portion, and the second path is provided within the second portion. The third path is connected to the first path and the second path. A chiller unit is connected to the first path and the second path. The first path is extended within the first portion along the electrostatic chuck, and the second path is extended within the second portion along the electrostatic chuck. A coolant outputted from the chiller unit passes through the first path, the third path and the second path in sequence, and then is inputted to the chiller unit.

6 Claims, 4 Drawing Sheets

(56) References Cited

U.S. PATENT DOCUMENTS

| | | | |
|---|---|---|---|
| 2006/0076108 A1* | 4/2006 | Holland | H01L 21/67248 156/345.27 |
| 2006/0285270 A1 | 12/2006 | Lee | |
| 2011/0024047 A1 | 2/2011 | Nguyen | |
| 2014/0209596 A1* | 7/2014 | Lubomirsky | H01L 21/6831 219/465.1 |
| 2015/0376783 A1* | 12/2015 | Hanamachi | H01L 21/68792 118/500 |
| 2017/0092472 A1* | 3/2017 | Koiwa | H01J 37/32724 |

FOREIGN PATENT DOCUMENTS

| | | |
|---|---|---|
| JP | 2002-217178 A | 8/2002 |
| JP | 2005-089864 A | 4/2005 |
| JP | 2009-272535 A | 11/2009 |
| JP | 2010-123809 A | 6/2010 |
| JP | 2010-129766 A | 6/2010 |
| JP | 2012-028811 A | 2/2012 |
| JP | 2013-122067 A | 6/2013 |
| JP | 2014-011382 A | 1/2014 |
| KR | 10-2003-0074713 A | 9/2003 |

\* cited by examiner

PROCESSING APPARATUS FOR PROCESSING TARGET OBJECT

CROSS-REFERENCE TO RELATED APPLICATION

This application claims the benefit of Japanese Patent Application No. 2017-017846 filed on Feb. 2, 2017, the entire disclosures of which are incorporated herein by reference.

TECHNICAL FIELD

The embodiments described herein pertain generally to a processing apparatus for processing a processing target object within a chamber.

BACKGROUND

In a recent plasma etching process in which a relatively large heat input source is provided, in order to maintain a temperature of a wafer uniform, low and constant, there is proposed a direct expansion type temperature control system (Patent Documents 1 to 4) configured to be capable of performing a high-efficiency heat transfer. In the direct expansion type temperature control system capable of implementing such a high-efficiency heat transfer, it is required to control a pressure and a dryness of a coolant flowing in a path within a mounting table configured to mount thereon the processing target object, which serves as a vaporizer.

Patent Document 1 describes a technique regarding a plasma processing apparatus. The plasma processing apparatus disclosed in Patent Document 1 includes an electrode block, a holding stage and a cooling cycle. The electrode block has a dielectric film on a surface thereof, and a path for a coolant is formed within the electrode block. The holding stage is configured to hold thereon a semiconductor wafer with the dielectric film on the surface of the electrode block therebetween and perform a temperature control. The cooling cycle is equipped with a heat exchanger and a vaporizer. The heat exchanger includes a compressor, a condenser, an expansion valve and a heater. In this plasma processing apparatus, the electrode block is configured as the vaporizer of the cooling cycle, and a temperature of the electrode block is controlled by a direct expansion type temperature control device configured to expand the coolant by directly circulating the coolant into the electrode block.

Patent Document 2 discloses a technique regarding a plasma processing apparatus. In the plasma processing apparatus described in Patent Document 2, a coolant path provided in an electrostatic attraction electrode is configured as a vaporizer, and a direct expansion type cooling cycle is formed by connecting this coolant path with a compressor, a condenser and a first expansion valve. In this plasma processing apparatus, by providing a second expansion valve at the coolant path between the electrostatic attraction electrode and the compressor, a flow rate of the coolant is adjusted. The coolant path has a thin cylindrical structure.

Patent Document 3 discloses a technique regarding a plasma processing apparatus. The plasma processing apparatus described in Patent Document 3 is configured to excite a processing gas into plasma and perform a surface processing on a processing target sample placed on a sample table with the plasma. This plasma processing apparatus includes a coolant path which is provided in the sample table and constitutes a vaporizer of a cooling cycle. By controlling enthalpy of a coolant supplied into the coolant path, a gas-liquid two-phase flow pattern in the coolant path, that is, within the sample table is kept, so that a temperature of the processing target sample is controlled to be uniform within a surface thereof. In case that dry-out of the coolant occurs within the coolant path, which is caused by an increase of a heat input amount from the plasma or the like, the occurrence of the dry-out within the coolant path is suppressed by increasing a rotation number of the compressor. Further, in case that the coolant supplied into the coolant path has a liquid phase, the coolant is maintained in a gas-liquid two-phase state by controlling a temperature control water tank and a flow rate valve for heat exchange water.

Patent Document 4 describes a technique regarding a plasma processing apparatus and so forth. In the plasma processing apparatus recited in Patent Document 4, a ring-shaped coolant path is formed in a sample table. Since a heat transfer rate and a pressure loss of the coolant are increased with a rise of the dryness as the coolant flows from a coolant inlet port toward a coolant outlet port, these losses need to be suppressed. For the purpose, in the plasma processing apparatus described in Patent Document 4, a coolant supply amount is controlled such that the coolant is not completely vaporized within the coolant path, and the coolant path has a structure in which a cross sectional area of the coolant path is gradually enlarged from a first flow path toward a third flow path.

Patent Document 1: Japanese Patent Laid-open Publication No. 2005-089864
Patent Document 2: Japanese Patent Laid-open Publication No. 2012-028811
Patent Document 3: Japanese Patent Laid-open Publication No. 2010-129766
Patent Document 4: Japanese Patent Laid-open Publication No. 2009-272535

SUMMARY

In the direct expansion type temperature control system featuring the high-efficiency heat transfer, since the high-efficiency heat transfer is achieved by the vaporization of the coolant, a larger heat generation amount enables a higher-efficiency heat transfer. Since the heat generation amount is proportional to a vaporization amount of the coolant, it is required to increase a length and a cross sectional area of the coolant path in order to increase the heat generation amount. In this regard, as the path of the coolant provided within the mounting table configured to mount thereon the processing target object, which serves as the vaporizer, there is a demand for a path capable of achieving high heat generation property and pressure uniformity of the coolant.

In one exemplary embodiment, there is provided a processing apparatus for a processing target object. The processing apparatus includes a chamber main body; a mounting table which is provided within the chamber main body and configured to mount the processing target object thereon; and a chiller unit configured to output a coolant into the mounting table. The mounting table includes a cooling table in which the coolant outputted from the chiller unit is flown; and an electrostatic chuck provided on the cooling table. The cooling table includes a first portion, a second portion, a first path, a second path and a third path. The electrostatic chuck is provided on the first portion, and the first portion is provided on the second portion. The first path includes a first end portion and a second end portion, and is provided within the first portion. The second path includes a third end portion and a fourth end portion, and is provided within the second portion. The third path is connected to the first end portion of the first path and the third end portion of the second path, and is extended between the first end portion and the third end portion. The chiller unit is connected to the second end portion of the first path and the fourth end portion of the second path. The first path is extended within the first portion along the electrostatic chuck. The second path is extended within the second portion along the electrostatic chuck. The coolant outputted from the chiller unit is inputted into the second end portion of the first path to pass through the first path, the third path and the second path in sequence, and then is inputted to the chiller unit from the fourth end portion of the second path.

Since a high-efficiency heat transfer is achieved by the vaporization of the coolant, a larger heat generation amount enables the higher-efficiency heat transfer. In the processing apparatus, since the path of the coolant flown in the cooling table has a dual structure (the first path and the second path), a sufficiently large cross sectional area of the path and a sufficiently long length of the path are both achieved even if there is a limit (upper limit) in an internal volume of the cooling table in which the path is provided. Thus, a relatively large heat generation amount can be achieved. Further, since the path of the coolant flown in the cooling table has the dual structure, in the path of the coolant, an inlet through which the coolant is introduced and an outlet through which the coolant is discharged need not be provided within the one plane (for example, only at the first path). Thus, the number of folding portions (portions of the path having a relatively large curvature R, for example, pipe joints (bends)) required to arrange the inlet and the outlet within the corresponding one plane or the number of portions of the path required to be tightened is reduced. Therefore, a local variation of the pressure (flow) is reduced across the entire region of the path of the coolant flown in the cooling table, so that the pressure uniformity can be improved.

The first path may include a region having an approximately regular cross sectional area. Since a vaporization temperature of the coolant varies depending on the pressure, it is desirable that the variation of the pressure within the cooling table is small. This variation of the pressure depends on a variation of the cross sectional area of the path rather than on a variation of the length of the path, so that if the variation of the cross sectional area is small, the variation of the pressure is reduced. Accordingly, in the present exemplary embodiment, since the first path may include the region having the approximately regular cross sectional area, the local pressure variation between the one end of the first path and the other end thereof is reduced, so that higher pressure uniformity of the coolant within the first path can be obtained. As a result, the vaporization temperature of the coolant, which is dependent on the pressure, can be made more uniform.

The third path may be extended between an inside of the first portion and an inside of the second portion to be overlapped with a central portion of the electrostatic chuck, when viewed from above the electrostatic chuck. The first path may be extended from the first end portion to the second end portion in a spiral shape along the electrostatic chuck, when viewed from above the electrostatic chuck. The second path may be extended from the third end portion to the fourth end portion in a spiral shape along the electrostatic chuck, when viewed from above the electrostatic chuck. The paths of the dual structure (the first path and the second path) are both extended in the spiral shapes along the electrostatic chuck when viewed from above the electrostatic chuck.

Thus, even when there is the limit in the internal volume of the cooling table, the sufficiently long path length can be obtained.

The processing apparatus may further include a pressure control device. The cooling table may further include a first heat transfer space. The first heat transfer space is extended along the electrostatic chuck between the first portion and the second portion. The pressure control device is connected to the first heat transfer space and configured to adjust an internal pressure of the first heat transfer space. The first heat transfer space is provided between the first path and the second path within the cooling table, and is extended along the electrostatic chuck, the same as the first path and the second path. With this configuration, a heat amount that can be conducted to the second path from the first portion can be adjusted by adjusting the internal pressure of the first heat transfer space. Thus, a rate (amount and time) of the heat generation can be adjusted precisely.

The first heat transfer space may be airtightly divided into multiple first regions. The pressure control device is connected to each of the multiple first regions and configured to adjust an internal pressure of each of the multiple first regions. Since the first heat transfer space is airtightly divided into the multiple first regions and the pressure control device is connected to each of the first regions, the internal pressure of the first heat transfer space can be adjusted for each first region of the first heat transfer space individually. Therefore, the rate (amount and time) of heat generation can be precisely adjusted for each first region of the first heat transfer space.

The processing apparatus may further include a second heat transfer space. The second heat transfer space is provided between the electrostatic chuck and the cooling table, and extended along the electrostatic chuck. The pressure control device is connected to the second heat transfer space, and configured to adjust an internal pressure of the second heat transfer space. A heat amount that can be conducted to the cooling table from the electrostatic chuck can be adjusted by adjusting the internal pressure of the second heat transfer space. As a result, the rate (time and amount) of the heat generation can be precisely adjusted.

The second heat transfer space may be airtightly divided into multiple second regions. The pressure control device is connected to each of the multiple second regions and configured to adjust an internal pressure of each of the multiple second regions. Since the internal pressure of second the heat transfer space can be adjusted for each second region of the second heat transfer space individually, the rate (time and amount) of the heat generation can be precisely adjusted for each second region of the second heat transfer space individually.

As stated above, as the path of the coolant provided within the mounting table configured to mount thereon the processing target object, which serves as the vaporizer, it is possible to provide the path capable of achieving high heat generation property and pressure uniformity of the coolant.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
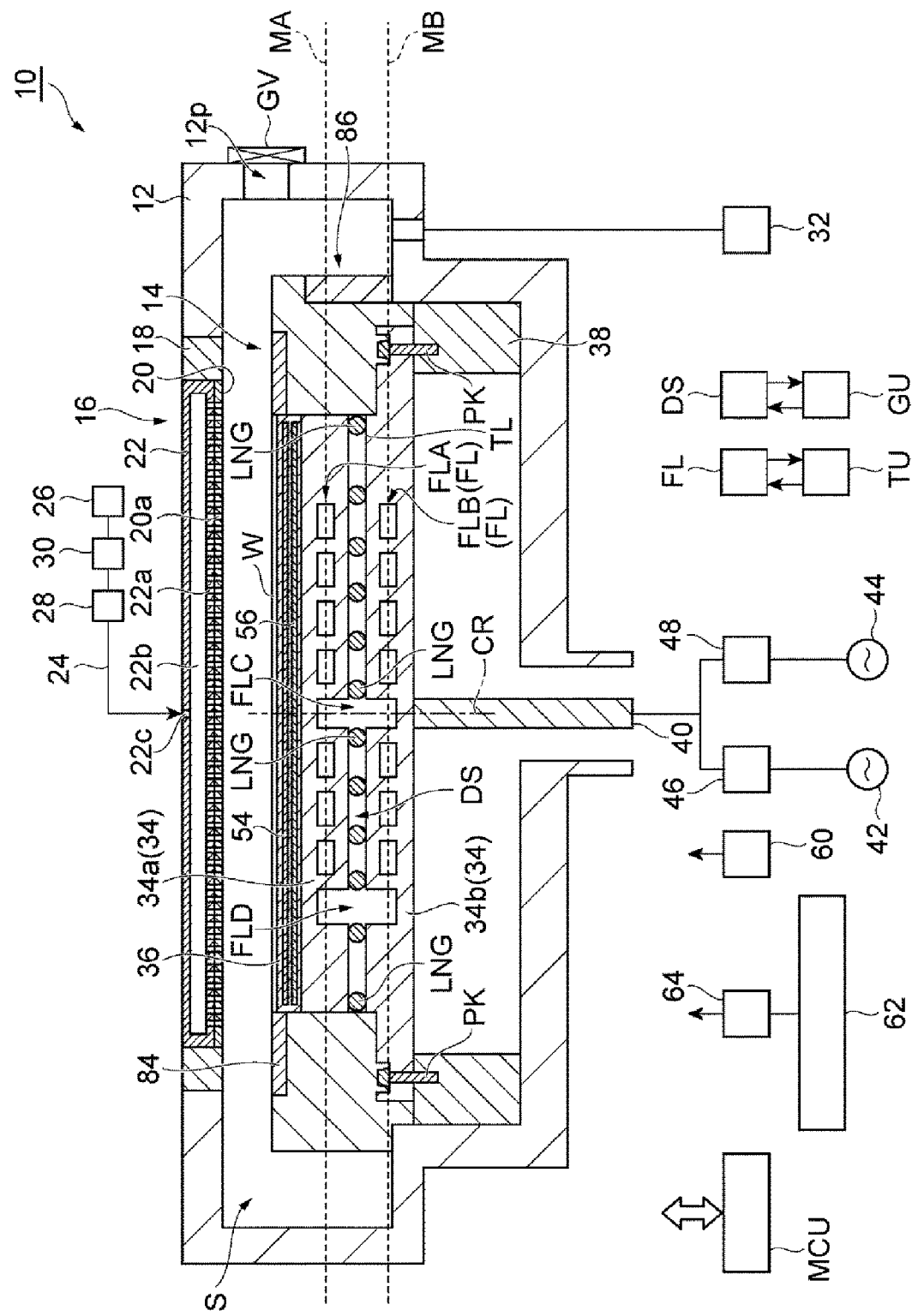
FIG. 1 is a diagram schematically illustrating a processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

Figure 2:
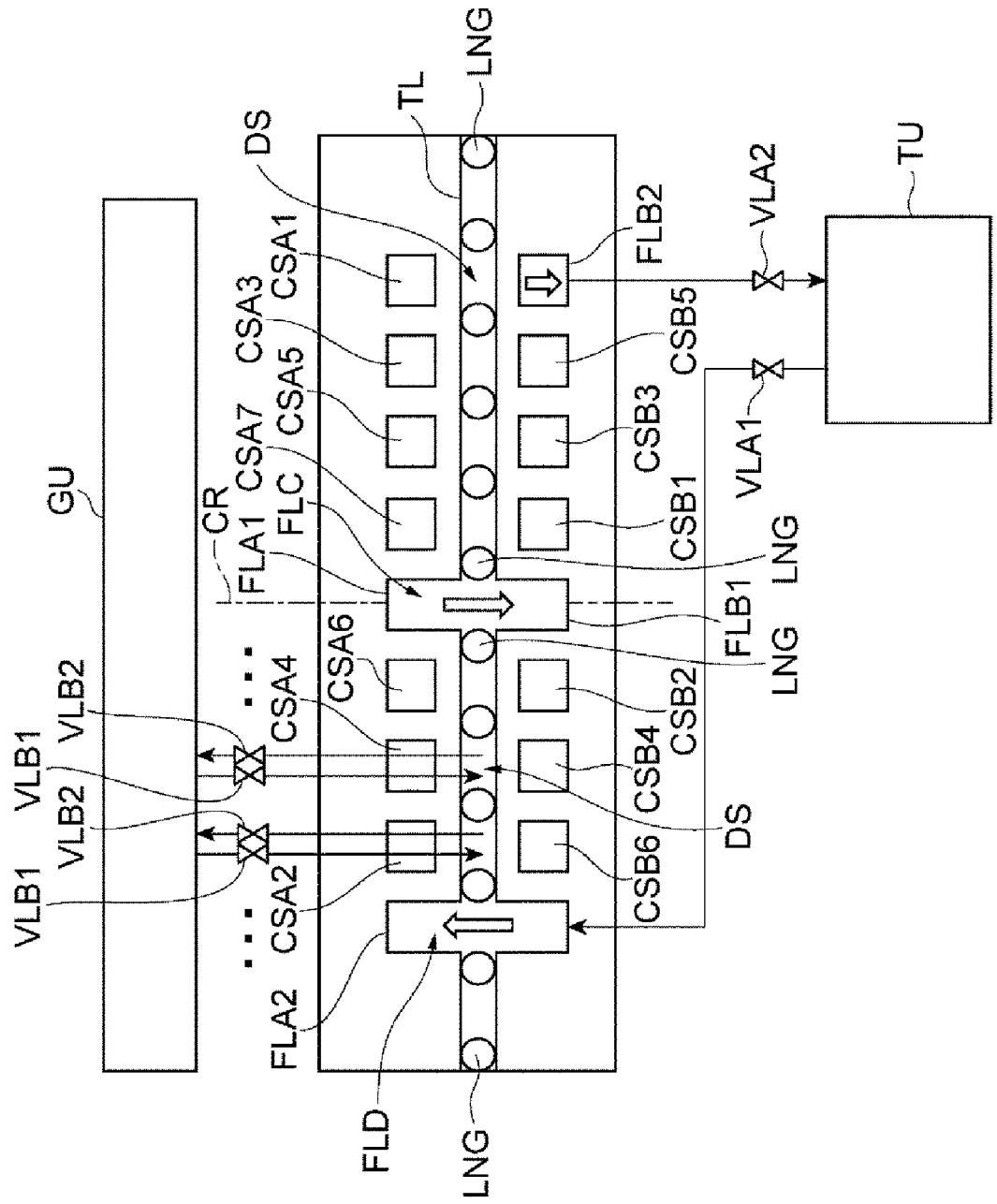
FIG. 2 is a diagram schematically illustrating configurations of a path of a coolant and an insulating layer provided in a cooling table according to the exemplary embodiment.
Figure 3B:
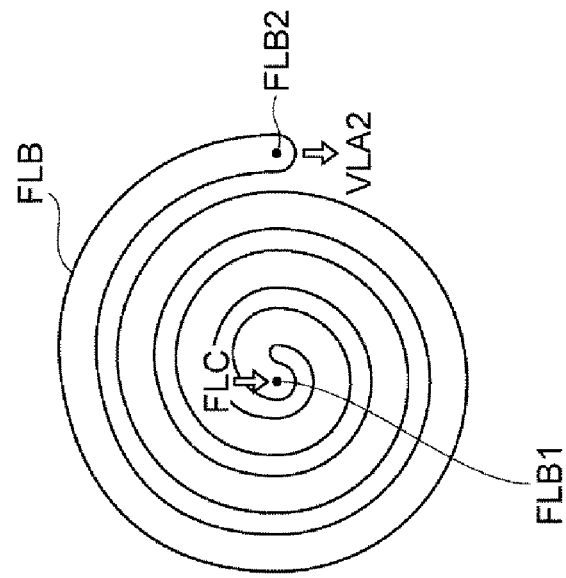
FIG. 3B is a diagram schematically illustrating a plan view of a lower portion of the corresponding path.

Referring to FIG. 1 to FIG. 3B, a configuration of a processing apparatus according to an exemplary embodiment will be explained. FIG. 1 is a diagram schematically illustrating the processing apparatus according to the exemplary embodiment. FIG. 2 is a diagram schematically illustrating a configuration of a path of a coolant and a configuration of an insulating layer in a cooling table according to the exemplary embodiment. FIG. 3A is a diagram schematically illustrating a plan view of an upper portion of the path shown in FIG. 1 and FIG. 2 according to the exemplary embodiment, and shows a cross section of a first path taken along a plane shown in FIG. 1 (along a plane (plane MA) parallel to a surface of an electrostatic chuck shown in FIG. 1). FIG. 3B is a diagram schematically illustrating a plan view of a lower portion of the path and illustrates a cross section of a second path taken along a plane shown in FIG. 1 (along a plane (plane MB) parallel to the surface of the electrostatic chuck shown in FIG. 1). A processing apparatus 10 shown in FIG. 1 to FIG. 3B is configured as a capacitively coupled plasma processing apparatus. The processing apparatus 10 is configured to process a processing target object (sometimes referred to as "processing target object W"). The processing apparatus 10 includes a chamber main body 12, a mounting table 14, an upper electrode 16, a pipeline 24, a gas source 26, a flow rate controller 28, a valve 30, a gas exhaust device 32, a high frequency power supply 42, a high frequency power supply 44, a matching device 46, a matching device 48, a DC power supply 60, a heater power supply 62, a filter 64, a controller MCU, a chiller unit TU, a valve VLA1, a valve VLA2, a pressure control device GU, a plurality of valves VLB1, a plurality of valves VLB2, and a plurality of screws PK. The chamber main body 12 includes an opening 12p, a supporting member 18, a ceiling plate 20, gas discharge holes 20a, a supporting body 22, communication holes 22a, a gas diffusion space 22b, a port 22c, and a gate valve GV. The mounting table 14 includes a cooling table 34, an electrostatic chuck 36, a supporting member 38, a power feed body 40, an attraction electrode 54, a heater 56, a focus ring 84, and an insulating member 86. The cooling table 34 includes a first path FLA, a second path FLB, a connection path FLC (third path), and a connection path FLD. The cooling table 34 includes a heat transfer space TL (first heat transfer space). The cooling table 34 is also provided with a multiple number of elastic members LNG arranged in the heat transfer space TL.

The chamber main body 12 has an approximately cylindrical shape, and an internal space thereof is configured as a processing space S in which the processing target object W is processed. The chamber main body 12 is made of, by way of example, but not limitation, aluminum. An alumite film and/or a film made of ceramic such as yttrium oxide having plasma resistance is formed on a surface of the chamber main body 12 at a side of the internal space thereof. The chamber main body 12 is electrically grounded. The opening 12p through which the processing target object W is carried into or out of the processing space S is formed at a sidewall of the chamber main body 12. The opening 12p is configured to be opened/closed by the gate valve GV. The processing target object W has a disk shape like a wafer.

The mounting table 14 is structured to mount thereon the processing target object W, and is provided within the chamber main body 12. The mounting table 14 is configured to support the processing target object W within the processing space S. The mounting table 14 has a function of attracting the processing target object W and a function of adjusting a temperature of the processing target object W, and has a structure in which a high frequency power is supplied to the cooling table 34 which mounts the electrostatic chuck 36 thereon. Details of the mounting table 14 will be described later.

The upper electrode 16 is disposed within an upper opening of the chamber main body 12, and is placed approximately in parallel with a lower electrode of the mounting table 14 to be described later. The insulating supporting member 18 is provided between the upper electrode 16 and the chamber main body 12.

The ceiling plate 20 has an approximately disk shape. The ceiling plate 20 may have conductivity. The ceiling plate 20 is made of, by way of non-limiting example, silicon or aluminum, and a ceramic film having plasma resistance is formed on a surface of the ceiling plate 20. The ceiling plate 20 is provided with the multiple gas discharge holes 20a. The gas discharge holes 20a are extended in an approximately vertical direction (in a direction heading toward the mounting table 14 from the ceiling plate 20).

The supporting body 22 is configured to support the ceiling plate 20 in a detachable manner. The supporting body 22 is made of, by way of non-limiting example, aluminum. The gas diffusion space 22b is formed in the supporting body 22. The multiple communication holes 22a are extended from the gas diffusion space 22b to communicate with the gas discharge holes 20a, respectively. The gas diffusion space 22b is connected to the pipeline 24 via the port 22c. The pipeline 24 is connected to the gas source 26. The flow rate controller 28 such as a mass flow controller and the valve 30 are provided at portions of the pipeline 24.

The gas exhaust device 32 includes one or more pumps such as a turbo molecular pump or a dry pump; and a pressure control valve. The gas exhaust device 32 is connected to a gas exhaust opening formed at the chamber main body 12.

When the processing apparatus 10 is operated, the processing target object W is placed on and held by the mounting table 14. A processing gas from the gas source 26 is supplied into the chamber main body 12, and as the gas exhaust device 32 is operated, the processing space S within the chamber main body 12 is decompressed. A high frequency electric field is formed between the upper electrode 16 and the lower electrode of the mounting table 14. Accordingly, the processing gas is dissociated, so that the processing target object W is processed by active species of molecules and/or atoms in the processing gas. In this processing, the individual components of the processing apparatus 10 are controlled by the controller MCU.

The mounting table 14 is equipped with the cooling table 34 and the electrostatic chuck 36. The electrostatic chuck 36 is provided on the cooling table 34. The cooling table 34 is supported by the supporting member 38 which is extended upwards from a bottom portion of the chamber main body 12. The supporting member 38 is an insulating member, and is made of, by way of non-limiting example, aluminum oxide (alumina). The supporting member 38 has an approximately cylindrical shape.

The power feed body 40 is connected to the cooling table 34. The power feed body 40 is implemented by, for example, a power feed rod, and is connected to a bottom surface of the cooling table 34. The power feed body 40 is made of aluminum or an aluminum alloy. The power feed body 40 is electrically connected to the high frequency power supply 42 and the high frequency power supply 44 which are provided at an outside of the chamber main body 12. The high frequency power supply 42 is configured to generate a first high frequency power for plasma generation. The first high frequency power has a frequency of, e.g., 40 MHz. The high frequency power supply 44 is configured to generate a second high frequency power for ion attraction. The second high frequency power has a frequency of, e.g., 13.56 MHz.

The high frequency power supply 42 is connected to the power feed body 40 via the matching device 46. The matching device 46 is equipped with a matching circuit configured to match an impedance at a load side of the high frequency power supply 42 with an output impedance of the high frequency power supply 42. The high frequency power supply 44 is connected to the power feed body 40 via the matching device 48. The matching device 48 is equipped with a matching circuit configured to match an impedance at a load side of the high frequency power supply 44 with an output impedance of the high frequency power supply 44.

The cooling table 34 is made of a metal having conductivity, such as aluminum. The cooling table 34 has an approximately disk shape. The cooling table 34 has a first portion 34a, a second portion 34b, a path FL of the coolant (the first path FLA and the second path FLB), and the connection path FLC. Further, the cooling table 34 has the heat transfer space TL. The electrostatic chuck 36 is provided on the first portion 34a. The first portion 34a is provided on the second portion 34b. The second portion 34b is provided on the power feed body 40. The heat transfer space TL is provided between the first portion 34a and the second portion 34b. The second portion 34b is fixed to the supporting member 38 by the screws PK.

The first path FLA of the path FL has an end portion FLA1 (first end portion) and an end portion FLA2 (second end portion). The first path FLA is provided within the first portion 34a. The first path FLA is extended within the first portion 34a along the electrostatic chuck 36. The first path FLA may have a region having an approximately regular cross sectional area. The second path FLB of the path FL has an end portion FLB1 (third end portion) and an end portion FLB2 (fourth end portion). The second path FLB is provided within the second portion 34b. The second path FLB is extended within the second portion 34b along the electrostatic chuck 36. In the exemplary embodiment, the second path FLB may have a region having an approximately regular cross sectional area, like the first path FLA, but not limited thereto. The chiller unit TU is connected to the end portion FLA2 of the first path FLA via the valve VLA1 and the connection path FLD in sequence, and is also connected to the end portion FLB2 of the second path FLB via the valve VLA2.

The connection path FLC is connected to the end portion FLA1 of the first path FLA and the end portion FLB1 of the second path FLB, and extended between the end portion FLA1 and the end portion FLB1. When viewed from above the electrostatic chuck 36, the connection path FLC is extended between the inside of the first portion 34a and the inside of the second portion 34b to be overlapped with a central portion (a region including a central axis CR of the cooling table 34) of the electrostatic chuck 36. The connection path FLD is extended from the inside of the first portion 34a to the inside of the second portion 34b.

The coolant outputted from the chiller unit TU is introduced into the end portion FLA2 of the first path FLA via the valve VLA1 and the connection path FLD in sequence, flown through the first path FLA, the connection path FLC and the second path FLB in sequence, and is then inputted into the chiller unit TU from the end portion FLB2 of the second path FLB via the valve VLA2. In this way, the coolant can be circulated between the chiller unit TU and the cooling table 34 (the connection path FLD, the first path FLA, the connection path FLC and the second path FLB). In the exemplary embodiment, the coolant outputted from the chiller unit TU may be of a type in which heat is absorbed by vaporization thereof to perform cooling. This coolant may be, for example, a hydrofluorocarbon-based coolant.

Figure 3A:
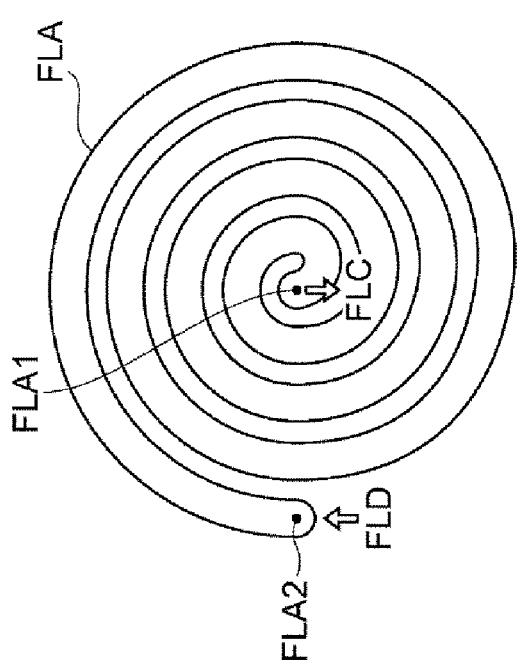
FIG. 3A is a diagram schematically illustrating a plan view of an upper portion of the path shown in FIG. 1 and FIG. 2 according to the exemplary embodiment.

In a plan view seen from above the electrostatic chuck 36, the first path FLA is extended from the end portion FLA1 to the end portion FLA2 in a spiral shape along the electrostatic chuck 36. To be more specific, on a cross section of the first path FLA taken along the plane MA shown in FIG. 1, as illustrated in FIG. 3A, the first path FLA is extended within the first portion 34a to be two-dimensionally expanded in the spiral shape to the end portion FLA2 from the end portion FLA1 located on the central axis CR of the cooling table 34 which passes through an approximately center portion (the position of the power feed body 40 when viewed from the top) of the surface of the electrostatic chuck 36, when viewed from above the corresponding surface of the electrostatic chuck 36. The end portion FLA1 of the first path FLA located on the central axis CR is connected to the connection path FLC. The end portion FLA2 of the first path FLA is located at a position of the first path FLA farthest from the central axis CR and connected to the connection path FLD. In case that the coolant outputted from the chiller unit TU through the valve VLA1 flows into the first path FLA via the connection path FLD, within the first path FLA, the coolant passes through the end portion FLA2, a cross section CSA1, a cross section CSA2, a cross section CSA3, a cross section CSA4, a cross section CSA5, a cross section CSA6 and a cross section CSA7 in sequence, and, then, reaches the end portion FLA1 and the connection path FLC in sequence.

In a plan view seen from above the electrostatic chuck 36, the second path FLB is extended from the end portion FLB1 to the end portion FLB2 in a spiral shape along the electrostatic chuck 36. To be more specific, on a cross section of the second path FLB taken along the plane MB shown in FIG. 1, as illustrated in FIG. 3B, the second path FLB is extended within the second portion 34b to be two-dimensionally expanded in the spiral shape to the end portion FLB2 from the end portion FLB1 located on the central axis CR of the cooling table 34 which passes through the approximately center portion (the position of the power feed body 40 when viewed from the top) of the surface of the electrostatic chuck 36, when viewed from above the corresponding surface of the electrostatic chuck 36. The end portion FLB1 of the second path FLB located on the central axis CR is connected to the connection path FLC. The end portion FLB2 of the second path FLB is located at a position of the second path FLB farthest from the central axis CR and connected to the chiller unit TU via the valve VLA2. In case that the coolant, which has flown in the first path FLA, flows into the second path FLB from the end portion FLA1 of the first path FLA through the connection path FLC, within the second path FLB, the coolant passes through the end portion FLB1, a cross section CSB1, a cross section CSB2, a cross section CSB3, a cross section CSB4, a cross section CSB5 and a cross section CSB6 in sequence, and, then, reaches the chiller unit TU from the end portion FLB2 via the valve VLA2.

The connection path FLD is extended from the inside of the second portion 34b to reach the inside of the first portion 34a through the heat transfer space TL, and one of two end portions of the connection path FLD is connected to the end portion FLA2 of the first path FLA. The other end portion of the connection path FLD (that is, between the two end portions of the connection path FLD, the end portion which is not connected to the first path FLA) is connected to the chiller unit TU via the valve VLA1.

The heat transfer space TL is extended along the electrostatic chuck 36 between the first portion 34a and the second portion 34b. In the exemplary embodiment, the heat transfer space TL can be airtightly partitioned into multiple regions DS (multiple first regions). The pressure control device GU is connected to the heat transfer space TL and is configured to adjust an internal pressure of the heat transfer space TL. To be more specific, the pressure control device GU is connected to each of the multiple regions DS, and is capable of adjusting the internal pressure of each of the multiple regions DS individually. The pressure control device GU adjusts the internal pressure of the heat transfer space TL (particularly, the internal pressure of each of the multiple regions DS) by a supply/suction of a gas into/from the heat transfer space TL (particularly, each of the multiple regions DS).

Within the heat transfer space TL, the multiple regions DS are partitioned by the multiple number of elastic members LNG. The elastic members LNG are O-rings. The elastic members LNG firmly adhere to the first portion 34a and the second portion 34b, so that airtightness of the region DS is achieved. Further, a region of the connection path FLC within the heat transfer space TL is also partitioned by two elastic members LNG, and a region of the connection path FLD within the heat transfer space TL is also partitioned by two elastic members LNG. Furthermore, the number and the shape of the regions DS within the heat transfer space TL may be modified in various ways depending on conditions involved.

Heat insulating property within the heat transfer space TL (particularly, within each of the multiple regions DS) increases as the internal pressure thereof decreases. Accordingly, in case of performing rapid heat generation upon the processing target object W on the cooling table 34, the heat insulating property is lowered by setting the internal pressure of the heat transfer space TL (particularly, each of the multiple regions DS) to be relatively high. In case of increasing the temperature of the processing target object W on the cooling table 34 by heat input from plasma, the heat insulating property is increased by setting the internal pressure of the heat transfer space TL (particularly, each of the multiple regions DS) to be relatively low.

The electrostatic chuck 36 is provided on the cooling table 34. The cooling table 34 is configured as the lower electrode. The cooling table 34 has conductivity. The cooling table 34 may be made of, by way of example, ceramic prepared by aluminum nitride or silicon carbide having conductivity, or may be made of a metal (e.g., titanium). The electrostatic chuck 36 is connected to the cooling table 34 by being bonded thereto. The electrostatic chuck 36 has an approximately disk shape, and is made of ceramic such as, but not limited to, aluminum oxide (alumina).

The electrostatic chuck 36 is equipped with the attraction electrode 54 embedded therein. The attraction electrode 54 is implemented by an electrode film, and is electrically connected to the DC power supply 60. If a DC voltage is applied to the attraction electrode 54 from the DC power supply 60, the electrostatic chuck 36 generates an electrostatic force such as a Coulomb force and holds the processing target object W by this electrostatic force. The electrostatic chuck 36 is further equipped with the heater 56 embedded therein. The heater 56 is provided in the electrostatic chuck 36, and connected to the heater power supply 62. In the exemplary embodiment, the filter 64 is provided between the heater 56 and the heater power supply 62 to suppress the high frequency power from being introduced into the heater power supply 62.

The heater 56 is configured to raise the temperature of the processing target object W on the electrostatic chuck 36 for each of portions of the processing target object W (for example, in case that the processing target object W has a central portion including the central axis CR, a peripheral portion and an intermediate portion located between the central portion and the peripheral portion, for each of the central portion, the intermediate portion and the peripheral portion of the processing target object W, or for each of the multiple regions DS when viewed from above the processing target object W). Accordingly, under the control of the controller MCU, the heater 56 is capable of precisely uniforming the temperature of the processing target object W on the electrostatic chuck 36 in the entire region of the processing target object W.

The focus ring 84 is disposed to surround the electrostatic chuck 36. The focus ring 84 is extended along the surface of the electrostatic chuck 36 (the surface of the processing target object W).

The cooling table 34 and the like of the mounting table 14 is covered by one or more insulating members 86 on an outer surface thereof. The one or more insulating members 86 are made of, by way of example, but not limitation, aluminum oxide or quartz.

The controller MCU is configured to control the individual components of the processing apparatus 10. By way of example, the controller MCU may be a computer device including a processer and a storage device such as a memory. The controller MCU may control the individual components of the processing apparatus 10 by being operated according to programs and recipes stored in the storage device. Particularly, the controller MCU controls the chiller unit TU, the pressure control device GU, the valve VLA1, the valve VLA2, the valve VLB1 and the valve VLB2 to control the heat generation caused by the cooling table 34.

In the above-described processing apparatus 10 according to the exemplary embodiment, since a high-efficiency heat transfer is achieved by the vaporization of the coolant, a larger heat generation amount enables the higher-efficiency heat transfer. In the processing apparatus 10, since the path of the coolant flown in the cooling table 34 has a dual structure (the first path FLA and the second path FLB), a sufficiently large cross sectional area of the path and a sufficiently long length of the path are both achieved even if there is a limit (upper limit) in an internal volume of the cooling table 34 in which the path is provided. Thus, a relatively large heat generation amount can be achieved. Further, since the path of the coolant flown in the cooling table 34 has the dual structure, in the path of the coolant, an inlet through which the coolant is introduced and an outlet through which the coolant is discharged need not be provided within the one plane (for example, only at the first path FLA). Thus, the number of folding portions (portions of the path having a relatively large curvature R, for example, pipe joints (bends)) required to arrange the inlet and the outlet within the corresponding one plane or the number of portions of the path required to be tightened is reduced. Therefore, a local variation of the pressure (flow) is reduced across the entire region of the path of the coolant flown in the cooling table 34, so that the pressure uniformity can be improved.

Further, since a vaporization temperature of the coolant varies depending on the pressure, it is desirable that the variation of the pressure within the cooling table 34 is small. This variation of the pressure depends on a variation of the cross sectional area of the path rather than on a variation of the length of the path, so that if the variation of the cross sectional area is small, the variation of the pressure is reduced. Accordingly, in the present exemplary embodiment, since the first path FLA may include the region having the approximately regular cross sectional area, the local pressure variation between the one end of the first path FLA and the other end thereof (specifically, between the one end of the first path FLA connected to the connection path FLD and the other end of the first path FLA connected to the connection path FLC) is reduced, so that higher pressure uniformity of the coolant within the first path FLA can be obtained. As a result, the vaporization temperature of the coolant, which is dependent on the pressure, can be made more uniform.

Moreover, the paths of the dual structure (the first path FLA and the second path FLB) are both extended in the spiral shape along the electrostatic chuck 36 when viewed from above the electrostatic chuck 36. Thus, even when there is the limit in the internal volume of the cooling table 34, the sufficiently long path length can be obtained.

In addition, the heat transfer space TL is provided between the first path FLA and the second path FLB within the cooling table 34, and is extended along the electrostatic chuck 36, the same as the first path FLA and the second path FLB. With this configuration, a heat amount that can be conducted to the second path FLB from the first portion 34a can be adjusted by adjusting the internal pressure of the heat transfer space TL. Thus, a rate (amount and time) of the heat generation can be adjusted precisely.

Moreover, since the heat transfer space TL is airtightly divided into the multiple regions DS and the pressure control device GU is connected to each of the regions DS, the internal pressure of the heat transfer space TL can be adjusted for each region DS of the heat transfer space TL individually. Therefore, the rate (amount and time) of heat generation can be precisely adjusted for each region DS of the heat transfer space TL.

The above description of the exemplary embodiment is provided for the purpose of illustration, and it would be understood by those skilled in the art that various changes and modifications may be made without changing technical conception and essential features of the exemplary embodiment. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

Figure 4:
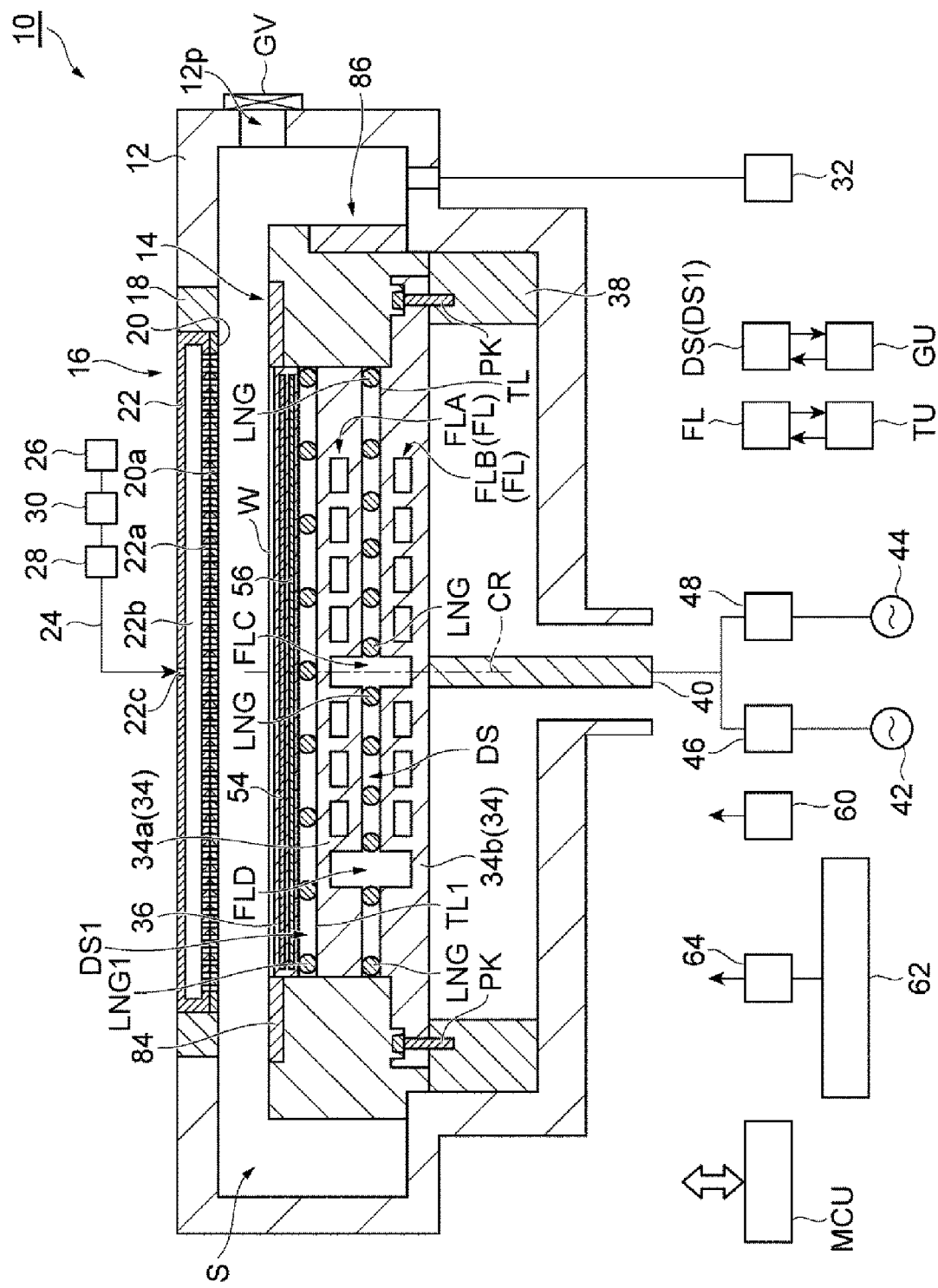
FIG. 4 is a diagram schematically illustrating another example of the processing apparatus according to the exemplary embodiment.

By way of example, as depicted in FIG. 4, the processing apparatus 10 according to the exemplary embodiment may have a configuration in which a heat transfer space TL1 (second heat transfer space) is provided between the cooling table 34 and the electrostatic chuck 36. FIG. 4 is a diagram schematically illustrating another example of the processing apparatus 10 according to the exemplary embodiment. The processing apparatus 10 shown in FIG. 4 further includes the heat transfer space TL1. The heat transfer space TL1 is provided between the electrostatic chuck 36 and the cooling table 34, and extended along the electrostatic chuck 36.

Further, the processing apparatus 10 shown in FIG. 4 further includes a multiple number of elastic members LNG1, and the heat transfer space TL1 of the processing apparatus 10 shown in FIG. 4 is airtightly partitioned into multiple regions DS1 (multiple second regions) by the multiple number of elastic members LNG1. Within the heat transfer space TL1, the respective regions DS1 are partitioned by the elastic members LNG1. The elastic members LNG1 are O-rings. The number and the shape of the regions DS1 within the heat transfer space TL1 may be modified in various ways depending on conditions involved, and so forth. The pressure control device GU is connected to each of the multiple regions DS1 and is configured to adjust an internal pressure of each of the multiple regions DS1 individually by a supply/suction of a gas into/from each region DS1.

Heat insulating property within the heat transfer space TL1 (particularly, within each of the multiple regions DS1) increases as the internal pressure thereof decreases. Accordingly, in case of performing rapid heat generation upon the processing target object W on the cooling table 34, the heat insulating property is lowered by setting the internal pressure of the heat transfer space TL1 (particularly, each of the multiple regions DS1) to be relatively high. In case of increasing the temperature of the processing target object W on the cooling table 34 by heat input from the plasma, the heat insulating property is increased by setting the internal pressure of the heat transfer space TL1 (particularly, each of the multiple regions DS1) to be relatively low.

As stated above, in the processing apparatus 10 illustrated in FIG. 4, a heat amount that can be conducted to the cooling table 34 from the electrostatic chuck 36 can be adjusted by adjusting the internal pressure of the heat transfer space TL1. As a result, the rate (time and amount) of the heat generation can be precisely adjusted. Further, since the internal pressure of the heat transfer space TL1 can be adjusted for each region DS1 of the heat transfer space TL1 individually, the rate (time and amount) of the heat generation can be precisely adjusted for each region DS1 of the heat transfer space TL1 individually.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A processing apparatus for a processing target object, comprising:
    a chamber main body;
    a mounting table which is provided within the chamber main body and configured to mount the processing target object thereon; and
    a chiller unit configured to output a coolant into the mounting table,
    wherein the mounting table comprises:
    a cooling table in which the coolant outputted from the chiller unit is flown; and
    an electrostatic chuck provided on the cooling table,
    the cooling table comprises a first portion, a second portion, a first path, a second path and a third path,
    the electrostatic chuck is provided on the first portion,
    the first portion is provided on the second portion,
    the first path comprises a first end portion and a second end portion, and is provided within the first portion,
    the second path comprises a third end portion and a fourth end portion, and is provided within the second portion,
    the third path is connected to the first end portion of the first path and the third end portion of the second path, and is extended between the first end portion and the third end portion,
    the chiller unit is connected to the second end portion of the first path and the fourth end portion of the second path,
    the first path is extended within the first portion along the electrostatic chuck,
    the second path is extended within the second portion along the electrostatic chuck,
    the coolant outputted from the chiller unit is inputted into the second end portion of the first path to pass through the first path, the third path and the second path in sequence, and then is inputted to the chiller unit from the fourth end portion of the second path,
    the cooling table further comprises the first heat transfer space extended along the electrostatic chuck between the first portion and the second portion,
    the first heat transfer space is airtightly partitioned from the first, second and third paths by at least one elastic member, wherein the at least one elastic member separates the third path from the first heat transfer space, and
    the processing apparatus further comprises a pressure control device connected to the first heat transfer space and configured to supply/suck a gas into/from the first heat transfer space to adjust an internal pressure of the first heat transfer space.

2. The processing apparatus of claim 1,
wherein the first path includes a region having an approximately regular cross sectional area.

3. The processing apparatus of claim 1,
wherein the third path is extended between an inside of the first portion and an inside of the second portion to be overlapped with a central portion of the electrostatic chuck, when viewed from above the electrostatic chuck,
the first path is extended from the first end portion to the second end portion in a spiral shape along the electrostatic chuck, when viewed from above the electrostatic chuck, and
the second path is extended from the third end portion to the fourth end portion in a spiral shape along the electrostatic chuck, when viewed from above the electrostatic chuck.

4. The processing apparatus of claim 1,
wherein the first heat transfer space is airtightly divided into multiple first regions by a plurality of elastic members, and
the pressure control device is connected to each of the multiple first regions and is configured to adjust individually each of internal pressures of the multiple first regions.

5. The processing apparatus of claim 1, further comprising:
    a second heat transfer space,
    wherein the second heat transfer space is provided between the electrostatic chuck and the cooling table, and extended along the electrostatic chuck, and
    the pressure control device is connected to the second heat transfer space, and is configured to adjust an internal pressure of the second heat transfer space.

6. The processing apparatus of claim 5,
wherein the second heat transfer space is airtightly divided into multiple second regions, and
the pressure control device is connected to each of the multiple second regions and is configured to adjust individually each internal pressures of the multiple second regions.

* * * * *